United States Patent [19]

Chabanne et al.

[11] Patent Number: 5,038,355
[45] Date of Patent: Aug. 6, 1991

[54] MATRIX OF MULTIPLEXED SYNCHRONIZED COUNTERS FOR AN INTEGRATED CIRCUIT

[75] Inventors: Raymond Chabanne, Ulis; Fabrice Mechadier, Gif sur Yvette; Edmond Merlin, Chatenay-Malabry, all of France

[73] Assignee: Cegelec, Perret, France

[21] Appl. No.: 507,802

[22] Filed: Apr. 12, 1990

[30] Foreign Application Priority Data

Apr. 12, 1989 [FR] France .................. 89 04817

[51] Int. Cl.$^5$ .................. G06F 9/46; G06F 15/20
[52] U.S. Cl. .................. 377/44; 364/900; 377/33
[58] Field of Search .................. 377/44, 33; 364/929.1

[56] References Cited

U.S. PATENT DOCUMENTS

| | | | |
|---|---|---|---|
| 4,089,156 | 5/1978 | Kashio | 368/112 |
| 4,161,787 | 7/1979 | Groves et al. | 364/900 |
| 4,195,292 | 3/1980 | Puhich | 377/44 |
| 4,477,918 | 10/1984 | Nossen et al. | 377/37 |
| 4,489,422 | 12/1984 | Paradise et al. | 377/44 |
| 4,713,832 | 12/1987 | Hutson | 377/45 |

FOREIGN PATENT DOCUMENTS 0180680 5/1986 European Pat. Off. .
0267612 5/1988 European Pat. Off. .

OTHER PUBLICATIONS

Patent Abstracts of Japan, vol. 6, No. 200 (E-135)[1078], Oct. 9, 1982; & JP-A-57 107 641 (Fujitsu K. K.) 7/5/82.

Primary Examiner—John S. Heyman
Attorney, Agent, or Firm—Sughrue, Mion, Zinn, Macpeak & Seas

[57] ABSTRACT

A matrix of multiplexed synchronous binary counters for an integrated circuit comprising a sequence of m counter cells (CC1, CCm) each provided with an individual data input link (Din.1, Din.m) and an individual data output link (Dout.1, Dout.m), and controlled by means of common links comprising a clock link (Clk) for synchronization, a load link (LOAD), and n select links (LS1 to LSn). Each counter cell (CC) includes n memory cells (CM1 CMn), each organized around a unique memory element (B1 to Bn) which is individually selectable by means of the select links (LS1 to LSn), which cells are connected in parallel between the individual data input link (Din) and the individual data output link (Dout) of the said counter cell (CC), and share a common loop memory element (BR) having its data input connected to the individual data ouput link of the counter cell under consideration (CC) via an incrementation circuit.

3 Claims, 2 Drawing Sheets

MATRIX OF MULTIPLEXED SYNCHRONIZED COUNTERS FOR AN INTEGRATED CIRCUIT

The invention relates to matrices of multiplexed synchronous binary counters suitable for inclusion in integrated circuits depending on requirements, and which are therefore parameterized as a function of requirements.

In general, and in a manner known for other functional subassemblies of integrated circuits, efforts are made to reduce as far as possible the areas required for making matrices of counters and the numbers of connections required for them to operate in an integrated circuit.

A conventional solution for obtaining a matrix of multiplexed synchronous counters, intended to comprise n m-bit binary counters, consists in defining a m-bit binary counter which is reproduced n times, with each of the resulting n counters being connected to the others by multiplexing logic.

An m-bit binary counter is generally a relatively complex circuit in which the (i−1) bits preceding a bit i are all used for calculating the bit i, and thus require a structure designed for this purpose.

In addition, each m-bit binary counter generally requires 2 m memory elements, i.e. 2 n.m memory elements for making the entire matrix mentioned above. Conventionnal binary counters use bistables of the flip-flop type controlled by one or other of the rising or falling edges of a binary type clock pulse signal.

Each bistable comprises two memory elements in cascade: the first storing an input bit while the clock signal is in one of its states, and the second copying said bit during the following state.

The invention therefore proposes a matric of multiplexed synchronous counters for an integrated circuit which, on being parameterized on request, makes it possible to achieve substantial savings over conventional matrices by virtue of the regularity and simplicity of its structure.

According to a characteristic of the invention, the matrix comprises a sequence of m counter cells each provided with an individual data input link and with an individual data output link and controlled by means of common links including a clock link for synchronization, a load link and n select links, and in that each counter cell includes n memory cells which, each organized about a single memory element and individually selectable by means of the select links, are connected in parallel between the individual data input link and the individual data output link of the counter cell which share a single loop memory element having its data input connected to the individual data output link of the counter cell under consideration via an incrementation circuit, and its output connected to the data input of each of the n parallel memory cells, said incrementation circuit being also connected firstly via an input link output from the incrementation circuit of the preceding counter cell in the sequence, and secondly via an output link constituting an input to the incrementation circuit of the following counter cell in the sequence, when such cells exist, thereby enabling binary carry signals to be transmitted from one counter cell to the next.

The matrix of multiplexed synchronous binary counters of the invention is intended to be included in an integrated circuit and is designed to include a number n of m-bit multiplexed synchronous binary counters where both n and m are numbers that can be parameterized on request.

Figure 1:
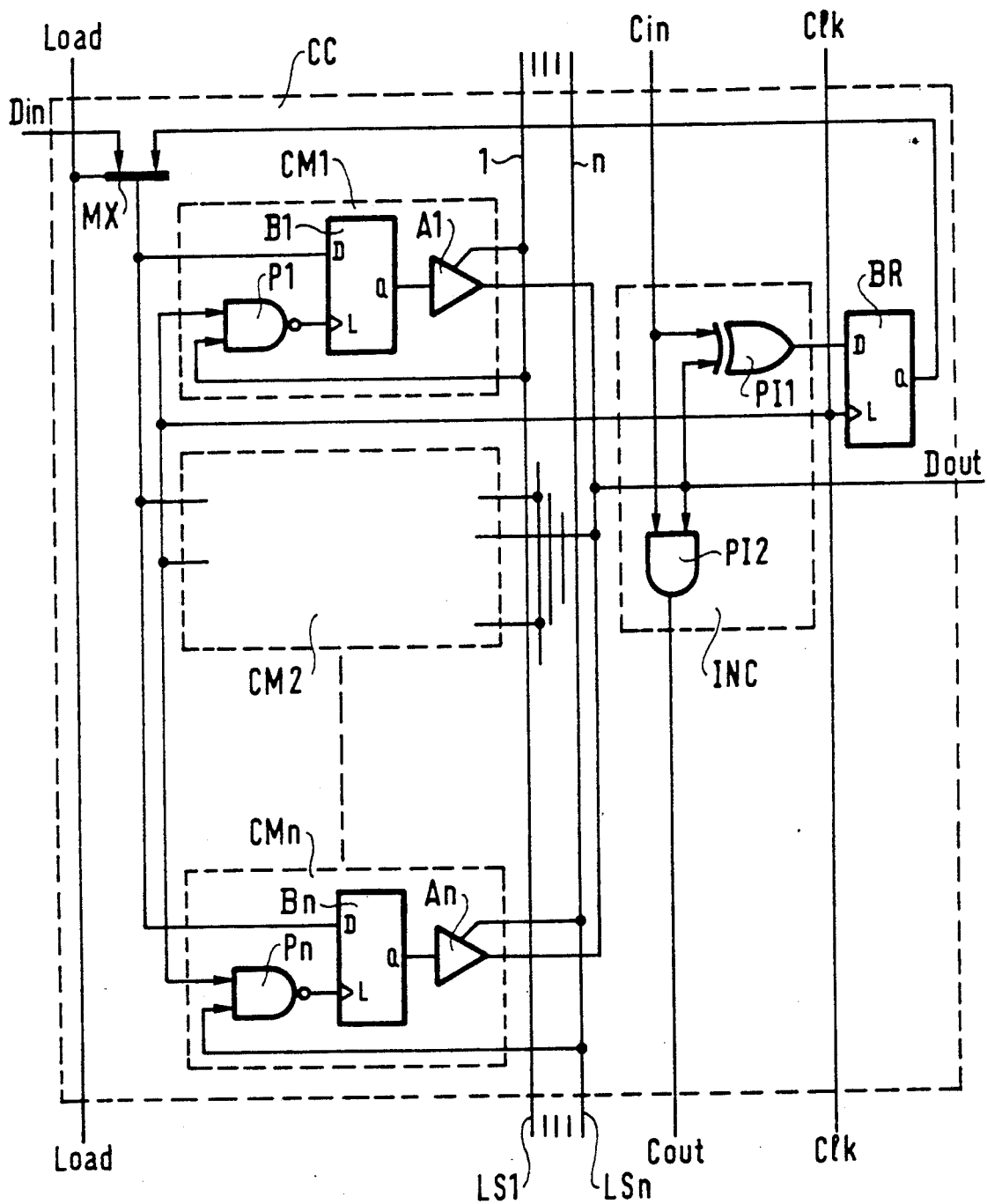
FIG. 1 shows an example of a counter cell in accordance with the invention.

To this end, the matrix is constructed from m counter cells CC1 to CCm each comprising n 1-bit synchronous counters, with one of these m counter cells CC being shown in FIG. 1.

Each counter cell CC includes n memory cells referenced CM1, CM2, and CMn, with each memory cell being organized around a single memory element, e.g. a D type storage bistable flip-flop B such as B1 or Bn.

Each of the n memory cells CM in the same counter cell CC is capable of being selected by means of n select links LS1 to LSn, shown in this case in the form of parallel connections running along one of the two rectangular directions of the matrix plane.

Each select link LS acts on one of the memory cells CM in a counter cell CC and is connected for this purpose in the memory cell CM under consideration both to one input of a NAND gate P such as P1 or Pn, and to a control of an output amplifier A from said cell, e.g. A1 or An.

Each gate p has a second input receiving an external clock signal Clk for synchronizing all of the memory cells. The output signal from each gate P is applied to the clock input of the storage bistable B of the memory cell CM containing the gate.

The individual bit input of each of the storage bistables B in a given counter cell CC is connected to the single output of a multiplexer MX which is common to all of these bistables.

The multiplexer MX has two data inputs which are selectively addressable by means of a LOAD link so as to transmit in alternation, either the signal from a data input link Din individual to the counter cell CC under consideration, or the signal from a memory element, in this case a D type loop bistable BR contained in the counter cell CC.

The loop bistable BR of a counter cell receives the same clock signal Clk as the bistables B in the counter cell and its data input is connected to the output of an incrementer INC.

The incrementer INC of a counter cell CC is organized around an incrementation gate PI1 of the exclusive-OR type whose output is connected to the data input of the loop bistable BR in the counter cell CC which contains the incrementation gate PI1. One of the inputs of the gate PI1 is connected to an output link Dout to which the outputs of the n amplifiers A1 to An of the memory cells CM contained in the counter cell CC under consideration are connected in parallel.

A second input of the incrementation gate PI1 is connected to a carry-in link Cin suitable for forcing the output of the loop bistable BR to binary level 1 in the absence of binary level 1 data delivered by that one of the storage bistables B1 to Bn which is selected at a given instant in the counter cell CC under consideration.

An AND type gate PI2 incorporated in the incrementer INC has one input connected to the carry-in link Cin which is accessible from outside the counter cell CC under consideration. A second input of the gate PI2 is connected to the output link Dout from the amplifiers A1 to An in the counter cell CC, from which the link Dout extends. The output of the gate PI2 leads to a carry-out link Cout going outside the counter cell in which it is included, as does the data input link Din.

Figure 2:
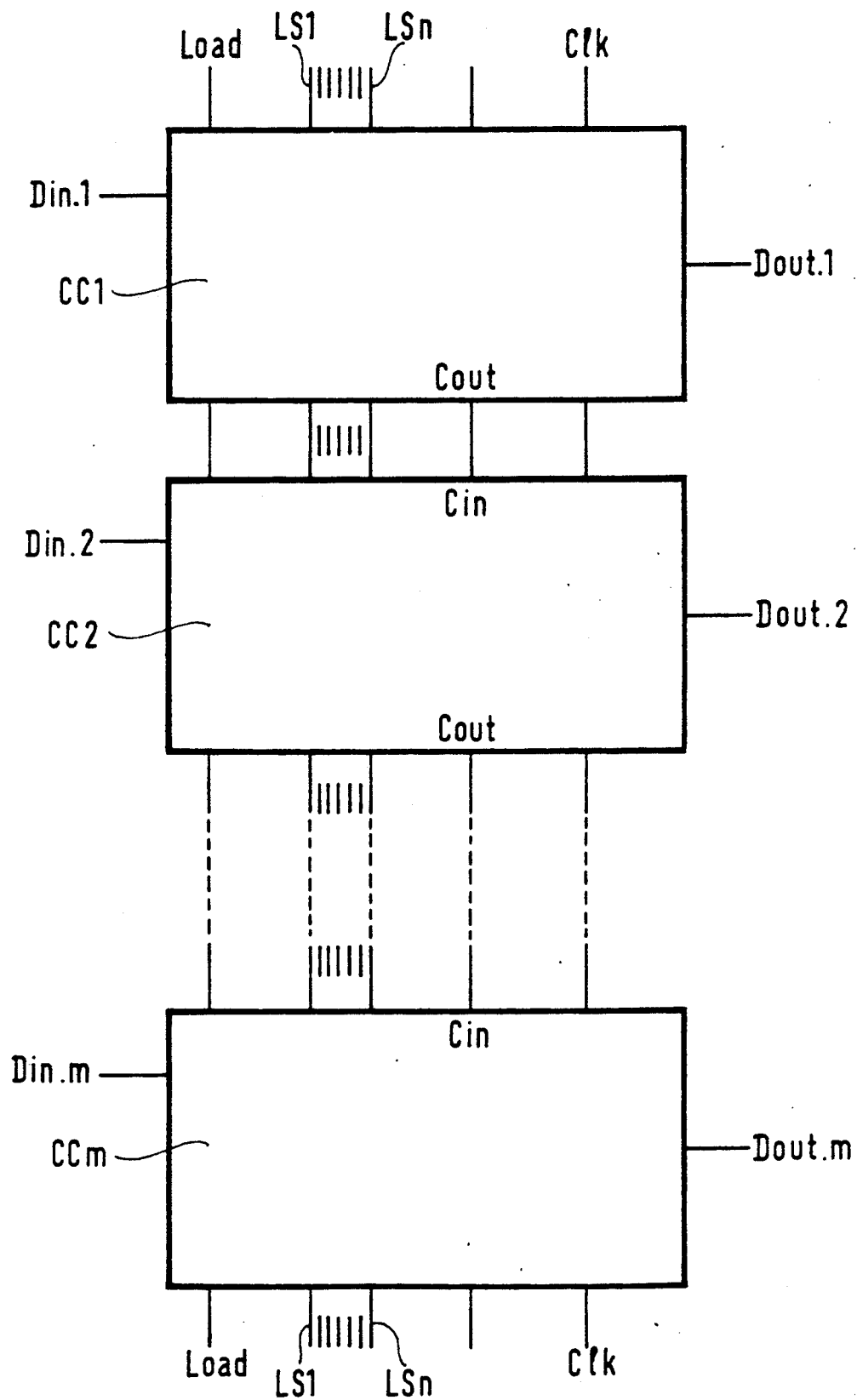
FIG. 2 shows the organization of a matrix of counters in accordance with the invention.

The load link, the select links LS1 to LSn and the clock link are common to the plurality of counter cells CC1 to CCn in the same multiplexed synchronous binary counter matrix, as can be seen in FIG. 2 and these links are made use of by a logic circuit external to the matrix and not shown, serving to control the link to a clock which is likewise external and not shown.

The load link enables a predetermined value to be loaded into each of the storage bistables B of a matrix at a rate of one storage bistable per counter cell CC and per period in the clock signal delivered by the data input link Clk.

To this end, the link Din, such as Din.1 or Din.m of each counter cell transmits a signal of binary value one or zero depending on requirements to the multiplexer MX to which it is individually connected. This multiplexer applies the signal in parallel to the data inputs of each of the storage bistables BM of the counter cell containing it.

This signal is taken into account by one only of the storage bistables in the counter cell, which storage bistable is the bistable whose associated gate P receives a binary select signal as transmitted thereto via the select link LS to which the said gate is connected.

The links Cin and Cout of a counter cell CC in a matrix extend respectively towards each of the counter cells between which the counter cell in question is located in the sequence of counter cells constituting the matrix, except for the cells at the two ends of the sequence, naturally.

The link Cout transmits a binary carry-out signal from one memory cell CM selected by a link LS in a counter cell CC to a memory cell CM likewise selected by the same link LS in the following counter cell CC via the link Cin of said following cell, and so on.

Cells containing n one-bit counters are thus obtained which require only n+1 memory cells to be provided in each counter cell.

The corresponding matrix therefore uses only m.(n+1) memory elements, is highly regular in structure, and possesses only a small number of links.

What is claimed is:

1. A matrix of multiplexed synchronous binary counters for an integrated circuit, the matrix being characterized in that it comprises a sequence of m counter cells (CC1, CCm) each provided with an individual data input link (Din.1, Din.m) and with an individual data output link (Dout.1, Dout.m) and controlled by means of common links including a clock link (Clk) for synchronization, a load link (LOAD) and n select links (LS1 to LSn), and in that each counter cell (CC) includes n memory cells (CM1, CMn) which, each organized about a single memory element (B1 to Bn) and individually selectable by means of the select links (LS1 to LSn), are connected in parallel between the individual data input link (Din) and the individual data output link (Dout) of the counter cell (CC) which share a single loop memory element (BR) having its data input connected to the individual data output link of the counter cell (CC) under consideration via an incrementation circuit (INC), and its output connected to the data input of each of the n parallel memory cells (CM1, CMn), said incrementation circuit (INC) being also connected firstly via an input link (Cin) output from the incrementation circuit of the preceding counter cell in the sequence, and secondly via an output link (Cout) constituting an input to the incrementation circuit of the following counter cell in the sequence, when such cells exist, thereby enabling binary carry signals to be transmitted from one counter cell to the next.

2. A matrix of multiplexed synchronous binary counters for an integrated circuit according to claim 1, characterized in that each counter cell (CC) includes a multiplexer (MX) connected via one input to the individual data input link (Din) serving said cell, via a second input to the output from the loop memory element (BR) of the counter cell, via its output to the data input of the bistable flip-flop (B1, Bn) of each of the memory cells (CM1, CMn) of said counter cell, and via its control input to the load link (LOAD) of the matrix.

3. A matrix of multiplexed synchronous binary counters for an integrated circuit according to claim 2, characterized in that the memory element (B1, Bn) included in each memory cell (B1, Bn) of a counter cell (CC1, CCn) is a D type bistable whose clock input is controlled by means of a respective NAND type gate (P1, Pn) having one input connected to the clock link (Clk), having another input connected to one of the select links (LS1, LSn), said bistable also having its data input connected to the output of the multiplexer (Mx) of the counter cell in which it is included, and its output connected to the individual data output link (Dout) of said counter cell via an output amplifier (A1, An) whose control input is connected to the same select link as the NAND type gate (P1) contained in the same memory cell as said bistable.

* * * * *